United States Patent
Li et al.

(10) Patent No.: US 9,800,144 B2
(45) Date of Patent: Oct. 24, 2017

(54) PASSIVE COMPONENT WITH TEMPERATURE COMPENSATION AND ELECTRONIC DEVICE USING THE SAME

(71) Applicant: Acer Incorporated, New Taipei (TW)

(72) Inventors: Po-Yu Li, New Taipei (TW); Kuan-Chi Juan, New Taipei (TW); Meng-Chieh Tsai, New Taipei (TW)

(73) Assignee: Acer Incorporated, New Taipei (TW)

( * ) Notice: Subject to any disclaimer, the term of this patent is extended or adjusted under 35 U.S.C. 154(b) by 568 days.

(21) Appl. No.: 14/472,393

(22) Filed: Aug. 29, 2014

(65) Prior Publication Data
US 2015/0100174 A1    Apr. 9, 2015

(30) Foreign Application Priority Data
Oct. 7, 2013   (TW) ............................. 102136237 A

(51) Int. Cl.
| | |
|---|---|
| *G05D 3/12* | (2006.01) |
| *H02M 3/156* | (2006.01) |
| *G01R 19/00* | (2006.01) |
| *H02M 1/00* | (2006.01) |
| *H02M 1/32* | (2007.01) |

(52) U.S. Cl.
CPC ......... *H02M 3/156* (2013.01); *G01R 19/0092* (2013.01); *H02M 2001/0009* (2013.01); *H02M 2001/327* (2013.01)

(58) Field of Classification Search
None
See application file for complete search history.

(56) References Cited

U.S. PATENT DOCUMENTS

| | | | | | |
|---|---|---|---|---|---|
| 4,687,909 | A | * | 8/1987 | Eichler | ................. A23N 12/08 219/400 |
| 4,901,701 | A | * | 2/1990 | Chasteen | ................ F02D 37/02 123/478 |
| 5,233,362 | A | * | 8/1993 | Villaseca | ............. H01Q 1/1242 343/712 |

(Continued)

FOREIGN PATENT DOCUMENTS

| | | |
|---|---|---|
| CN | 102624230 | 8/2012 |
| CN | 102967755 | 3/2013 |

(Continued)

*Primary Examiner* — Adam Lee
(74) *Attorney, Agent, or Firm* — Jianq Chyun IP Office

(57) ABSTRACT

A passive component with temperature compensation and an electronic device using the same are provided. The electronic device includes a central processor unit (CPU), a filter and a power conversion circuit. The filter includes the passive component and a variable resistor. The passive component includes an inductor and a negative temperature coefficient (NTC) resistor. The NTC resistor is contacted with a surface of the inductor, and the NTC resistor and the inductor are disposed in a package. The power conversion circuit provides a current information to the CPU according to a partial voltage difference of the filter. The power conversion circuit controls an output voltage through the filter according to a first control signal of the CPU, so as to provide the output voltage. The electronic device further includes an embedded controller. The embedded controller controls the variable resistor according to a second control signal of the CPU.

6 Claims, 1 Drawing Sheet

(56) References Cited

U.S. PATENT DOCUMENTS

| | | | | |
|---|---|---|---|---|
| 5,939,863 A * | 8/1999 | Miller | H02H 3/087 | |
| | | | 320/136 | |
| 6,086,676 A * | 7/2000 | Kao | C23C 14/54 | |
| | | | 118/695 | |
| 6,525,395 B1 | 2/2003 | Kawase et al. | | |
| 6,576,998 B1 * | 6/2003 | Hoffman | H01L 21/56 | |
| | | | 257/685 | |
| 7,015,654 B1 * | 3/2006 | Kuhlmann | H02M 3/156 | |
| | | | 315/291 | |
| 7,358,710 B2 | 4/2008 | Luo et al. | | |
| 7,362,174 B2 * | 4/2008 | Cao | H03F 3/195 | |
| | | | 330/253 | |
| 8,386,229 B1 * | 2/2013 | Anderson | G06F 17/5036 | |
| | | | 703/13 | |
| 8,597,979 B1 * | 12/2013 | Burgyan | H01L 23/3121 | |
| | | | 257/686 | |
| 2003/0034796 A1 * | 2/2003 | Tsujiguchi | H01L 23/66 | |
| | | | 326/22 | |
| 2003/0064749 A1 * | 4/2003 | Soini | H04M 1/21 | |
| | | | 455/556.1 | |
| 2003/0179550 A1 * | 9/2003 | Nebrigic | H01L 23/04 | |
| | | | 361/729 | |
| 2004/0238941 A1 * | 12/2004 | Satoh | H01L 23/49816 | |
| | | | 257/698 | |
| 2006/0126255 A1 * | 6/2006 | Slater | H02H 9/042 | |
| | | | 361/118 | |
| 2007/0096345 A1 * | 5/2007 | Bultitude | H05K 3/301 | |
| | | | 257/787 | |
| 2007/0241727 A1 * | 10/2007 | Luo | H02M 3/1588 | |
| | | | 323/272 | |
| 2008/0074074 A1 * | 3/2008 | Skibinski | H02M 7/003 | |
| | | | 318/800 | |
| 2009/0147440 A1 * | 6/2009 | Cygan | H01G 4/232 | |
| | | | 361/306.3 | |
| 2009/0276641 A1 * | 11/2009 | Peng | G06F 1/26 | |
| | | | 713/300 | |
| 2010/0060371 A1 * | 3/2010 | Mirow | H03L 5/00 | |
| | | | 331/183 | |
| 2011/0090020 A1 * | 4/2011 | Reeser | H03B 5/326 | |
| | | | 331/155 | |
| 2011/0170258 A1 * | 7/2011 | Single | B25F 5/008 | |
| | | | 361/688 | |
| 2013/0076468 A1 * | 3/2013 | Zurke | H01F 5/04 | |
| | | | 335/299 | |
| 2013/0234790 A1 * | 9/2013 | Lai | H02M 3/156 | |
| | | | 327/574 | |
| 2014/0009077 A1 * | 1/2014 | Yoshimoto | H05B 33/0815 | |
| | | | 315/210 | |
| 2014/0175882 A1 * | 6/2014 | Casteel | G05F 3/02 | |
| | | | 307/31 | |

FOREIGN PATENT DOCUMENTS

| | | |
|---|---|---|
| TW | 200941907 | 10/2009 |
| TW | M427724 | 4/2012 |
| TW | 201232217 | 8/2012 |
| TW | 201312915 | 3/2013 |
| TW | 201324110 | 6/2013 |

* cited by examiner

PASSIVE COMPONENT WITH TEMPERATURE COMPENSATION AND ELECTRONIC DEVICE USING THE SAME

CROSS-REFERENCE TO RELATED APPLICATION

This application claims the priority benefit of Taiwan application serial no. 102136237, filed on Oct. 7, 2013. The entirety of the above-mentioned patent application is hereby incorporated by reference herein and made a part of this specification.

BACKGROUND OF THE INVENTION

Field of the Invention

The present invention generally relates to a passive component, and in particular, to a passive component with temperature compensation and an electronic device using the same.

Description of Related Art

The power conversion circuit provides a DC output voltage to the central processing unit (CPU) through the inductor. The CPU in order to calculate the power consumption of itself which needs to indirectly receive the current flowing through the inductor through the sensing circuit. Since the inductor itself has a parasitic resistance, the sensing circuit uses the voltage difference between the two ends of the inductor to convert the current value which flows through thereof.

Besides, when the current flows through the inductor, it may generate heat and increase the resistance of the parasitic resistance. It may install a negative temperature coefficient (NTC) resistor in the conventional method. However, the NTC resistor is unable to accurately compensate for the errors generated by the inductor while at work. The actual output current value and the current value of the conversion through sensing are often inconsistent. Since sensing is inaccurate, when performing over-clocking, it is easy to cause the output voltage to exceed the maximum power supply range.

SUMMARY OF THE INVENTION

In view of this, the present invention provides a passive component with temperature compensation and an electronic device using the same to solve the problems described in Description of Related Art.

The present invention provides a passive component with temperature compensation comprising an inductor, a negative temperature coefficient (NTC) resistor and package. The NTC resistor contacts with a surface of the inductor. The package covers the inductor and the NTC resistor.

In the embodiment of the present invention, the size of the package is length 7 millimeters (mm), width 7 mm, and height 3 mm.

In the embodiment of the present invention, the inductor comprises a first pin and a second pin. The NTC resistor comprises a third pin and a fourth pin.

The present invention also provides an electronic device comprising a central processing unit (CPU), a filter and a power conversion circuit. The filter is coupled to the CPU. The filter comprises a passive component and a variable resistor. The passive component comprises an inductor and a negative temperature coefficient (NTC) resistor, the NTC resistor is contacted with a surface of the inductor, and the NTC resistor and the inductor are disposed in a package. The power conversion circuit is coupled to the filter and the CPU. The power conversion circuit provides the current information to the CPU according to a partial voltage difference of the filter. The power conversion circuit controls an output voltage through the filter according to a first control signal of the CPU, so as to provide the output voltage.

In the embodiment of the present invention, wherein the electronic device further comprises an embedded controller. The embedded controller is coupled to the CPU and the variable resistor. The embedded controller controls the variable resistor according to a second control signal of the CPU.

In the embodiment of the present invention, wherein the first end of the variable resistor is coupled to an output stage of the power conversion circuit and the first end of the inductor, the second end of the variable resistor is coupled to the first end of the NTC resistor. The filter further comprises a first resistor and a first capacitor. The first end of the first resistor is coupled to the second end of the NTC resistor, the second end of the first resistor is coupled to the second end of the inductor. The second end of the first resistor is coupled to the second end of the inductor. The first capacitor is coupled between the first end of the NTC resistor and the second end of the first resistor. A coupling position of the second end of the inductor, the second end of the first resistor, and the first capacitor which provides the output voltage.

In the embodiment of the present invention, wherein the power conversion circuit further comprises a sensing circuit, a control circuit and a driving circuit. The sensing circuit provides the current information according to the partial voltage difference. The control circuit receives the current information, the output voltage and the first control signal to provide a pulse modulation signal. The driving circuit is coupled to the control signal and the output stage, the driving circuit controls the output stage according to the pulse modulation signal, so as to convert an input voltage to the output voltage.

In the embodiment of the present invention, wherein the CPU is connected to the control circuit and the embedded controller through a system management bus.

In the embodiment of the present invention, wherein when the CPU calculates the power which reaches to a first power threshold value, the CPU generates the second control signal to reduce the partial voltage difference.

Based on the above, in the passive component with temperature compensation and an electronic device using the same of the present invention, the package of the passive component directly covers the inductor and the NTC resistor. The NTC resistor contacts with the surface of the inductor and changes the resistance in response to the temperature of the inductor. Due to the package has eliminate the role of the air medium, so that the NCT resistor can fully compensate for the errors caused by current flowing through the inductor, therefore when the sensing circuit is sensing, the sensing results are accurate. On the other hand, when the CPU calculates the using power reaching to the first power threshold value, the CPU can generate the control signal to reduce the partial voltage difference, so as to increase the output voltage.

It should be understood that, the foregoing general description and the following detailed description is only illustrative and explanatory, and it does not limit the desired claim scope of the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
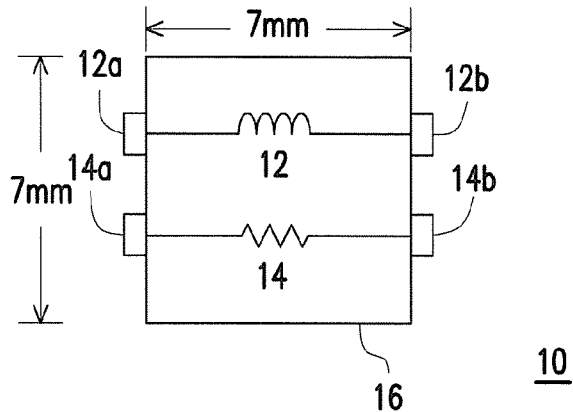
FIG. 1 is a configuration diagram illustrating a passive component with temperature compensation according to an embodiment of the present invention.

Reference will now be made in detail to the exemplary embodiments of the invention, examples of which are illustrated in the accompanying drawings. Moreover, elements/components with the same or similar reference numerals represent the same or similar parts in the drawings and embodiments.

The applicant of the present invention has carefully studied that the reason of using the negative temperature coefficient resistor used in Description of Related Art but result in the inaccurate voltage difference caused by sensing between two ends of the inductor is: the NCT resistor and the inductor are not directly contacted between each other and there exists the air. The air is one of the cooling mediums. When the negative temperature coefficient resistor responds to the heat of the inductor via the air, the partial heat may loss with the air. So that the NTC resistor is unable to accurately compensate for the errors caused by the current flow through the inductor.

FIG. 1 is a configuration diagram illustrating a passive component with temperature compensation according to an embodiment of the present invention. Referring to FIG. 1. The passive component 10 comprises a inductor 12, negative temperature coefficient (NTC) resistor 14 and a package 16. The package 16 covers the inductor 12 and the NTC resistor 14, and the NTC resistor 14 contacts with the surface of the inductor 12. As a result, the NTC resistor 14 can reply to the temperature change of the inductor 12 because it is directly contacted to the inductor 12, so that the NTC resistor 14 can effectively compensate for the errors caused by current flow through the inductor 12.

In the passive component 10, the inductor 12 may comprise pin 12a and 12b; the NTC resistor 14 may comprise pin 14a and 14b. The pin 12a is separated from the pin 14a, and the pin 12b is separated from the pin 14b.

It is worth noting that, the size of the package 16 may be length 7 millimeters (mm), width 7 mm, and height 3 mm, but the present invention is not limited thereto. Those skilled in the art can design the desired size according to the actual application.

Figure 2:
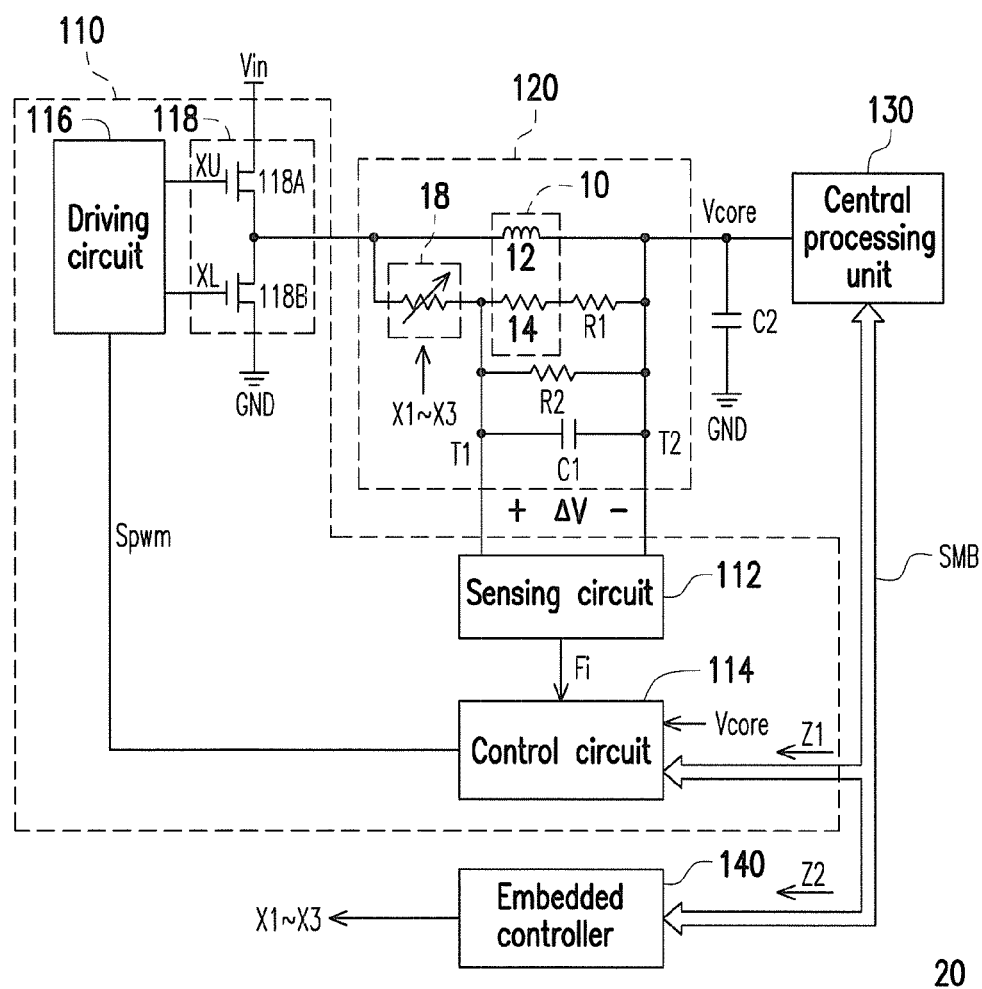
FIG. 2 is a circuit diagram illustrating an electronic device according to an embodiment of the present invention.

FIG. 2 is a circuit diagram illustrating an electronic device according to an embodiment of the present invention. Referring to FIG. 2. The electronic device 20 comprises a central processing unit (CPU) 130, a filter 120 and a power conversion circuit 110.

The power conversion circuit 110 comprises a sensing circuit 112, a control circuit 114, a driving circuit 116 and an output stage 118. The output stage 118 comprises a high side switch 118A and a low side switch 118B. The first end of the high side switch 118A receives an input voltage Vin. The low side switch 118B is coupled between the second end of the high side switch 118A and the ground end GND.

The filter 120 is coupled to the output stage 118 and the CPU 130. The filter 120 comprises a passive component 10 and a variable resistor 18. The passive component 10 comprises an inductor 12 and a NTC resistor 14, and the NTC resistor 14 contacts with the surface of the inductor 12 and both are disposed in the package 16. The power conversion circuit 110 is coupled to the filter 120 and the CPU 130.

The sensing circuit 112 provides a current information Fi to the control circuit 114 according to the partial voltage difference $\Delta V$ of the filter 120. The control circuit 114 transmits the current information Fi to the CPU 130 through the system management bus SMB. The CPU 130 may calculate the current using power according to the current information Fi and the output voltage Vcore.

The electronic device 20 further comprises an embedded controller (EC) 140. The EC 140 is coupled to the CPU 130 and the variable resistor 18.

When the CPU 130 plans to regulate the output voltage Vcore, the CPU may output a first control signal Z1 and/or a second control signal Z2. The control circuit 114 provides the pulse modulation signal Spwm to the driving circuit 116 according to the first control signal Z1 of the CPU 130 and/or the output voltage Vcore. The driving circuit 116 generates a high switch control signal XU and a low switch control signal XL according to the pulse modulation signal Spwm, so as to control the high switch 118A and the low switch 118B respectively. The output stage 118 is used to perform DC-DC conversion for the input voltage Vin, so that the power conversion circuit 110 provides the output voltage Vcore through the filter 120 and outputs the output voltage Vcore to the CPU 130.

The CPU 130 is coupled to the EC 140 through the system management bus SMB. The EC 140 may generate the control signal X1-X3 according to the second control signal Z2 of the CPU 130 to control the resistance of the variable resistor 18.

Furthermore, the filter 10 further comprises a resistor R1 and a capacitor C1. The first end of the variable resistor 18 is coupled to the output stage 118 and the first end of the inductor 12. The second end of the variable resistor 18 is coupled to the first end of the NTC resistor 14. The second end of the resistor R1 is coupled to the second end of the inductor 12. The capacitor C1 is coupled between the first end of the resistor R1 and the second end thereof. The coupling position (endpoint T2) of the second end of the inductor 12, the second end of the resistor R1, and the capacitor C1 provides the output voltage Vcore.

Besides, the filter 120 further comprises a resistor R2, the resistor R2 is coupled to a capacitor C1 in parallel. The electronic device 20 further comprises a capacitor C2. The capacitor C2 is coupled between the endpoint (output end) T2 and the ground end GND.

The CPU 130 may calculate the using power whether achieves the first power threshold to determine the amount of the power consumption.

In a specific application embodiment, if the power used by the CPU 130 has achieved the first power threshold and requires using a greater power continuously, the CPU 130 may control the filter 120 by the second control signal Z2. The EC 140 generates control signal X1-X3 according to the second control signal Z2, so as to increase the resistance of the variable resistor 18. According to the principle of partial voltage, as the resistance of the variable resistor 18 increases, the partial voltage difference $\Delta V$ between the end point T1 and T2 will decrease, so that the current information Fi sensed by the sensing circuit 112 may decrease. Thus, the control circuit 114 returns the less current information Fi to the CPU 130. Then, the CPU generates the first control signal Z1 to enable the power conversion circuit 110 to increase the output voltage Vcore. So that, the CPU unit 130 may use the greater power to maintain a high-performance operational status.

To sum up, in the passive component with temperature compensation and an electronic device using the same of the present invention, the package of the passive component directly covers the inductor and the NTC resistor. The NTC resistor is contacted with the surface of the inductor and changes the resistance in response to the temperature of the inductor. Due to the package has eliminate the role of the air medium, so that the NCT resistor can fully compensate for the errors caused by current flowing through the inductor, therefore when the sensing circuit is sensing, the sensing result is accurate. On the other hand, when the CPU calculates the using power which reaches to a first power threshold value, the CPU can generate the control signal to reduce the partial voltage difference, so as to increase the output voltage. So that, the CPU uses the greater power to maintain a high-performance operational status.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

Besides, any embodiments or claims of the present invention do not have to achieve the total purposes or advantages or disadvantages disclosed in the present invention. Furthermore, the abstract and the title are only used to assist with patent document searching, but the present invention is not limited thereto.

What is claimed is:

1. An electronic device comprising:
   a central processing unit (CPU);
   a filter, coupled to the CPU, wherein the filter comprises a passive component and a variable resistor, the passive component comprises a inductor and a negative temperature coefficient (NTC) resistor, the NTC resistor is contacted with a surface of the inductor, and the NTC resistor and the inductor are disposed in a package;
   a power conversion circuit, coupled to the filter and the CPU, the power conversion circuit provides a current information to the CPU according to a partial voltage difference of the filter, the power conversion circuit controls an output voltage through the filter according to a first control signal of the CPU, so as to provide the output voltage; and
   an embedded controller, coupled to the CPU and the variable resistor, controls the variable resistor according to a second control signal of the CPU,
   wherein the first end of the variable resistor is coupled to an output stage of the power conversion circuit and the first end of the inductor, the second end of the variable resistor is coupled to the first end of the NTC resistor, the filter comprising:
      a first resistor, the first end of the first resistor is coupled to the second end of the NTC resistor, the second end of the first resistor is coupled to the second end of the inductor; and
      a first capacitor, coupled between the first end of the NTC resistor and the second end of the first resistor, wherein a coupling position of the second end of the inductor, the second end of the first resistor, and the first capacitor provides the output voltage.

2. The electronic device according to claim 1, wherein the power conversion circuit further comprises:
   a sensing circuit, provides the current information according to the partial voltage difference; and
   a control circuit, receives the current information, the output voltage and the first control signal to provide a pulse modulation signal; and
   a driving circuit, coupled to the control circuit and the output stage, the driving circuit controls the output stage according to the pulse modulation signal, so as to convert an input voltage to the output voltage.

3. The electronic device according to claim 2, wherein the CPU is connected to the control circuit and the embedded controller through a system management bus.

4. The electronic device according to claim 3, wherein when the CPU calculates the using power reaching to a first power threshold value, generates the second control signal to the reduce the partial voltage difference.

5. The electronic device according to claim 1, wherein the size of the package is length 7 millimeters (mm), width 7 mm, and height 3 mm.

6. The electronic device according to claim 1, wherein the inductor comprises a first pin and a second pin, the NTC resistor comprises a third pin and a fourth pin.

* * * * *